(12) United States Patent
Yamada

(10) Patent No.: US 7,122,748 B2
(45) Date of Patent: Oct. 17, 2006

(54) SEMICONDUCTOR DEVICE HAVING PACKAGING STRUCTURE

(75) Inventor: Shigeru Yamada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 445 days.

(21) Appl. No.: 10/697,880

(22) Filed: Oct. 31, 2003

(65) Prior Publication Data

US 2004/0089464 A1 May 13, 2004

(30) Foreign Application Priority Data

Nov. 8, 2002 (JP) ............................. 2002/325769

(51) Int. Cl.
*H01L 23/28* (2006.01)
(52) U.S. Cl. ...................... 174/521; 174/260; 174/539; 174/564; 257/738
(58) Field of Classification Search ............... 174/52.2, 174/52.4, 260, 521, 535, 539, 540, 558, 564; 257/738, 778; 29/842, 843, 854, 855
See application file for complete search history.

(56) References Cited

U.S. PATENT DOCUMENTS

| | | | | |
|---|---|---|---|---|
| 5,590,090 A | * | 12/1996 | Duggal et al. | ................. 367/7 |
| 6,078,104 A | * | 6/2000 | Sakurai | ...................... 257/738 |
| 6,084,295 A | * | 7/2000 | Horiuchi et al. | ............ 257/690 |
| 6,114,754 A | * | 9/2000 | Kata | ........................... 257/668 |
| 6,476,503 B1 | * | 11/2002 | Imamura et al. | ............. 257/780 |
| 6,525,424 B1 | * | 2/2003 | Murata et al. | ............... 257/738 |
| 6,576,984 B1 | * | 6/2003 | Takahashi et al. | ........... 257/668 |
| 6,627,988 B1 | * | 9/2003 | Andoh | ........................ 257/706 |
| 6,713,880 B1 | * | 3/2004 | Sahara et al. | ................ 257/783 |
| 6,900,532 B1 | * | 5/2005 | Kelkar et al. | ................ 257/698 |

FOREIGN PATENT DOCUMENTS

| | | |
|---|---|---|
| JP | 2001-94003 | 4/2001 |
| JP | 2002-170921 | 6/2002 |
| JP | 2002-261190 | 9/2002 |

OTHER PUBLICATIONS

Nikkei Microdevices, Feb. 1999, p. 48-57—Not in English.
Nikkei Microdevices, Feb. 2000, p. 50-53 —Not in English.
Amkor Technology etCSP™, 2000, See Internet URL: http://www.amkor.com/Products/all_products/etcsp.cfm.

* cited by examiner

*Primary Examiner*—William H. Mayo
*Assistant Examiner*—Adolfo Nino
(74) *Attorney, Agent, or Firm*—Rabin & Berdo, PC

(57) ABSTRACT

There is provided a semiconductor device comprising a semiconductor chip whose main surface comprises first electrode pads; a wiring portion electrically connected to the electrode pad and including a bump portion that protrudes upward in a vertical direction with respect to the main surface; a sealing layer covering the perimeter and main surface of the chip; and a re-distribution wiring layer which electrically connected to the wiring portion and extending from a first portion of the sealing layer over the main surface to a second region of the sealing layer outside the first region.

30 Claims, 7 Drawing Sheets

SEMICONDUCTOR DEVICE HAVING PACKAGING STRUCTURE

BACKGROUND OF THE INVENTION

1. Field of the Invention

The present invention relates to a semiconductor device with a package structure.

2. Description of Related Art

Recent years have witnessed an ever-increasing demand for miniaturization and an increase in the density of semiconductor devices that are mounted in electronic devices such as portable devices, as well as for higher frequency transmission signals. Accordingly, CSPs (Chip Size Packages) which are semiconductor devices packaged such that the outer dimensions thereof are substantially the same as the outer dimensions of the semiconductor chip have been attracting attention.

With a view to reducing fabrication costs and so forth, recent years have more particularly seen the active development of WCSP (Wafer-level Chip Size Package) technology (for example, Publication 1: Nikkei Microdevices, February 1999 Edition, pages 48 to 56, FIGS. 1 and 4), which are CSPs produced by means of completion as far as the external terminal formation step of a wafer not subjected to further processing, followed by the creation of individual packages by means of dicing and so forth.

Such WCSPs include those with a structure in which external terminals, and electrode pads on the semiconductor chip, are electrically connected via a wiring layer in which the external terminals are rearranged in desired positions. On account of being a re-distribution wiring layer or being patterned, the wiring layer is also called a 'wiring pattern'.

WCSPs, which comprise this re-distribution wiring layer, afford the benefit of permitting increased freedom in the wiring design as a result of this re-distribution wiring layer.

On the other hand, for the purpose of implementing high density mounting, recent years have seen the application of stacked package-type MCPs (Multi Chip Packages) in which a plurality of chips are arranged in planar fashion or stacked in the thickness direction of the semiconductor chips within a single package (for example, Publication 2: Nikkei Microdevices, February 2000 Edition, pages 50 to 52, FIG. 1).

Furthermore, as a structure that raises the mount density still further, package stacked-type MCPs in which a plurality of packages are stacked in the thickness direction of the semiconductor chips are currently being proposed (for example, Publication 3: Amkor Technology etCSP™, See Internet URL: http://www.amkor.com/Products/all_products/etcsp.cfm).

However, because the WCSPs that comprise the re-distribution wiring layer described above are packages whose outer dimensions are substantially the same as the outer dimensions of the semiconductor chip as described earlier, there are limits on the number of external terminals that can be arranged on the mount face.

Stated in more detail, because current WCSPs have a fan-in structure, that is, a structure in which the external terminals are arranged above the semiconductor chip, the maximum number of external terminals that can be arranged is as many as about 160 (pins), and the minimum interval (pitch) between the external terminals is then about 0.5 mm.

In order to meet the demand for a greater number of pins in accordance with the higher integration of recent years, it is necessary to narrow the minimum interval between external terminals to about 0.4 mm, for example.

However, although setting the interval between external terminals at about 0.4 mm is technically feasible, such a practice is undesirable due to the requirement for a high density mounting technology when mounting the WCSP on the mount substrate.

Furthermore, in the case of a multiple pin class of about 300 pins, however narrow the external terminal interval may be, it is sometimes difficult to arrange all the pins on the mount substrate.

Therefore, BGAs (Ball Grid Arrays) and LGAs (Land Grid Arrays) that adopt a wire bonding (sometimes referred to simply as 'WB' hereinafter) method have been proposed, these being packages in which a semiconductor chip is mounted on a wiring substrate and having a structure that allows external terminals to be arranged over the whole of the reverse side of the wiring substrate.

However, since the inductance of the WB parts is high in the case of such structures in which the wire bonding (sometimes referred to simply as 'WB' hereinafter) method is normally adopted, impedance matching with the circuit in the semiconductor chip is problematic. Furthermore, because a wiring substrate that comprises bonding pads, and so forth, is required, not only does this lead to a thick package, fabrication costs are also increased.

Meanwhile, the flip chip method has been proposed as a wireless bonding method. However, because the interval between pads (electrode pads) on the semiconductor chip is then equal to or less than 0.1 mm, an expensive build-up substrate is required, and the flip bonding processing takes a long time. Hence such a method is not suited to mass production.

Further, also with the above-described stacked package-type MCPs, in the case of a structure that adopts the WB method, problems are produced which include increased inductance and an increase in the package outer dimensions and package thickness, and so forth, which are caused by WB, as described earlier.

Moreover, even with the above-described package stacked-type MCPs, in the case of a structure that adopts the WB method, not only are there problems that include increased inductance and an increase in the package outer dimensions and package thickness, and so forth, which are caused by WB, as described earlier, an increase in the number of pins of the MCP is also unsuitable because a fan-in structure cannot be achieved.

Accordingly, it is an object of the present invention to provide a semiconductor device whereby, on the basis of a WCSP structure for which a still wider range of application will be sought in the future, an increase in the number of pins through an enlargement of the mount face can be implemented, greater miniaturization than that known conventionally (miniaturization of the package size and thinner films) is achieved and a package stacked-type MCP and the like can be designed.

SUMMARY OF THE INVENTION

Therefore, the semiconductor device of the present invention has characteristics based on the following constitution.

That is, the semiconductor device according to the present invention comprises a semiconductor chip having provided on a main surface thereof electrode pads. The surfaces of these electrode pads are exposed via openings formed in an insulating film. Wiring portions are electrically connected to the exposed surfaces of the electrode pads, respectively. Each of the wiring portions includes a bump portion which protrudes so as to be substantially orthogonal to the main surface of the semiconductor chip. Each of these wiring portions are electrically connected to a wiring layer. The perimeter and main surface of the semiconductor chip is buried in or covered with a sealing layer which is provided so as to expose the surface of the wiring layer.

Further, according to the present invention, the wiring layer is provided in the surface of the sealing layer and so as to extend from a first region of the sealing layer over the main surface of the semiconductor chip to a second region of the sealing layer outside the first region.

According to the above-mentioned constitution, because a structure is provided that permits external terminals to be arranged, not only in a region above the semiconductor chip (the fan-in section), but also in a region other than above the semiconductor chip (the fan-out section), a semiconductor device with a fan-out structure which is more capable of adapting to an increase in the number of pins than an ordinary WCSP is produced.

In addition, with this constitution, because the semiconductor chip and the external terminals can be electrically connected via a re-distribution wiring layer like that described earlier, a semiconductor device with high frequency characteristics superior to those of a structure adopting the WB method is produced.

Further, with this constitution, a constitution in which a buried layer (sealing layer) originally formed with the objective of protecting the semiconductor device is also made to serve as a wiring layer base (interposer) is permitted.

Accordingly, it is possible to avoid a case where the signal transmission paths (wiring) form boundaries with a plurality of materials as per the case of a conventional fan-out structure (WB method and so forth).

As a result, because it is possible to suppress concentrations of stress and so forth which are produced due to there being a plurality of materials forming boundaries with the signal transmission paths, a highly reliable semiconductor device is produced regardless of the peripheral environment and the like.

Further, the semiconductor device of the present invention may be fabricated by a following process.

That is, a first stacked body is formed on the semiconductor chip (first stacked body formation step) by providing wiring portions which are electrically connected to the electrode pads provided on the semiconductor chip. These wiring portions each comprise a protrusion that protrudes so as to be substantially orthogonal to the main surface of the semiconductor chip. A second stacked body is then formed (second stacked body formation step) by providing a wiring layer that contacts the wiring portions on the main surface of a temporary substrate whose mount face is larger than the outer dimensions of the main surface of the semiconductor chip. This wiring layer extends, within the main surface of the temporary substrate, from the mount region of the semiconductor chip (or the region opposite the first stacked body (first region)) to a non-mount region of the semiconductor chip (or the region which is not opposite the first stacked body (second region)). The protrusions which the wiring portions comprise and the wiring layer are then joined (joining step). The first stacked body and the wiring layer are then covered (sealed) by the sealing layer, whereby a third stacked body that comprises the first and second stacked bodies is formed (third stacked body formation step). The temporary substrate is then peeled from the third stacked body (peeling step).

According to the method for fabricating a semiconductor device of the present invention, the same WCSP wiring process can be applied when forming the first and second stacked bodies, so that investments in new equipment can be suppressed. In addition, because the wiring layer which the semiconductor device comprises can be accurately formed by means of a transfer from the second stacked body to the first stacked body, fabrication costs can be reduced.

A fabrication process that includes the following steps during the fabrication of the semiconductor device of the present invention may be appropriate:

1. It may be preferable that before the second stacked body formation step, an insulating layer is formed as the surface layer of the mount face of the temporary substrate and the surface of this insulating layer is subjected to the first surface reforming step that serves to lower the adhesion of this surface with the sealing layer.

2. This first surface reforming step may preferably include subjecting the surface of the insulating layer to ashing processing.

3. The first stacked body formation step may preferably form an insulating film on the semiconductor chip such that the surfaces of the electrode pads are exposed, then form wiring portions by means of an electrically conductive member so that these wiring portions are electrically connected to the exposed surfaces of the electrode pads, and, prior to the third stacked body formation step after the second stacked body formation step, the surface of the insulating film may be preferably subjected to the second surface reforming step which serves to raise the adhesion of this surface with the sealing layer.

4. The second surface reforming step may preferably include subjecting the surface of the insulating film to polarity group introduction processing.

5. It may be preferable that before the third stacked body formation step after the joining step, the exposed surfaces of the wiring portions and the wiring layer are subjected to the third surface reforming step which serves to raise the adhesion of these portions and of this wiring layer with the sealing layer.

6. The third surface reforming step may preferably include subjecting the exposed surfaces of the wiring portions and the wiring layer to oxidation processing.

BRIEF DESCRIPTION OF THE DRAWINGS

The foregoings and other objects, features and advantageous of the present invention will be better understood from the following description taken in connection with the accompanying drawings, in which.

DESCRIPTION OF THE PREFERRED EMBODIMENTS

Figure 1A:
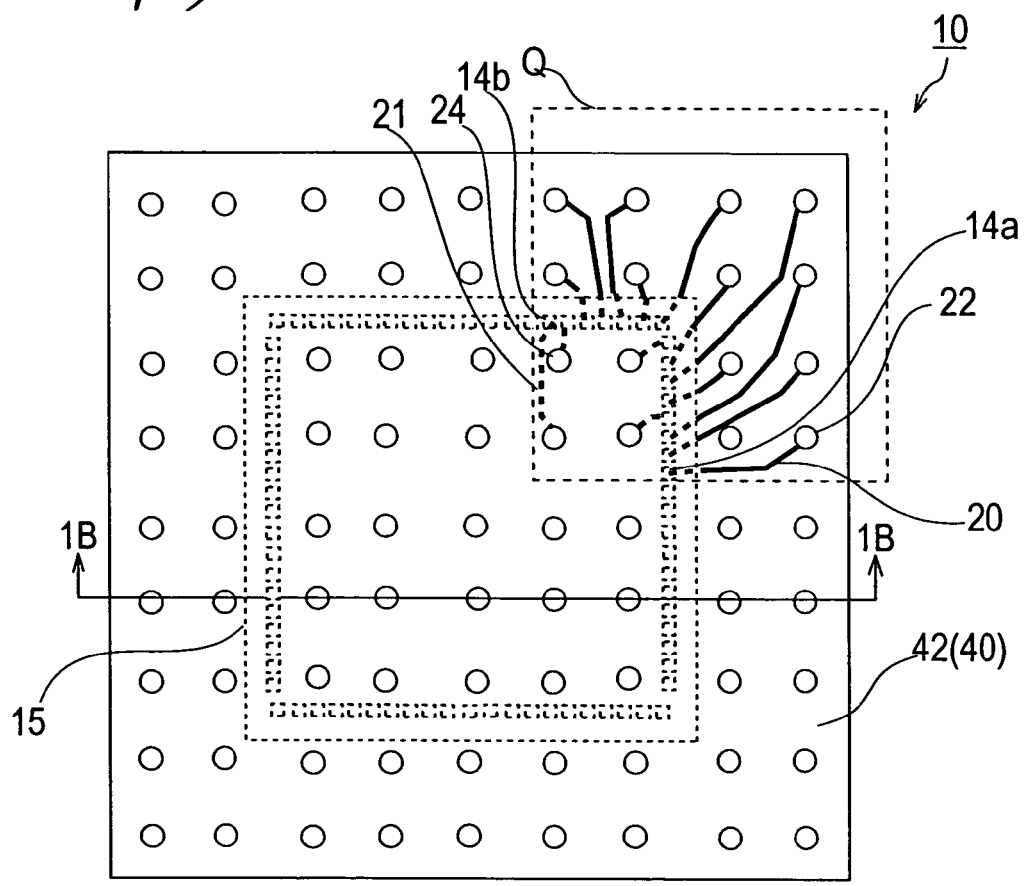
FIG. 1(A) shows a schematic planar view of a semiconductor device according to a first embodiment of the present invention.

Embodiments of the present invention will be described below with reference to FIGS. 1(A) to 9. Each of the drawings is a view schematically showing a constitutional example of the semiconductor device according to the present invention. Further, the drawings merely provide a schematic view of the shape, size and dispositional relationship of the constituent components to an extent permitting an understanding of the present invention, there being no intention to limit the present invention to the illustrated example. Further, in order to simply understanding of the drawings, hatching (slanted lines) denoting a cross-section is omitted except in parts. Further, in the following description, although specific materials and conditions and so forth are sometimes employed, these materials and conditions constitute no more than one preferred example, and hence the present invention is in no way limited to or by such an example. Further, the same numerals are shown allocated to the same constituent components in the drawings so that repetitive description is also avoided. Furthermore, in the following description, although the semiconductor device and the planar shape of the semiconductor chip are described as square, this shape could also be an optional preferred shape in accordance with the design.

First Embodiment

A description will now be provided for the semiconductor device and fabrication method thereof according to the first embodiment of the present invention, with reference to FIGS. 1(A) to 4(B). FIG. 1(A) is a schematic planar view of a semiconductor device 10 of this embodiment. Further, FIG. 1(B) is a schematic cross-sectional view as seen from the arrow direction in the figure of a section (cross-section) which is obtained by cutting FIG. 1 along the line 1B—1B of the broken line part. Further, with the exception of the region enclosed by the broken line Q in FIG. 1(A) (referred to as region Q hereinafter), the dispositional relationship between a first wiring layer (first re-distribution wiring layer) 20, a second wiring layer (a second re-distribution wiring layer) 21, first external terminals (first solder balls) 22 and second external terminals (second solder balls) 24 is not illustrated (this is also true for the following embodiments). In the figure, the first wiring layer 20 is shown with a thick solid line and the second wiring layer 21 is shown with a thick broken line.

As shown in FIG. 1(A), the semiconductor device 10 of the present invention comprises a semiconductor chip 15 and circuit elements are formed on the semiconductor chip 15. A plurality of electrode pads is provided on the main surface of the semiconductor chip 15. As the electrode pads, first and second electrode pads (14a and 14b respectively) that comprise aluminum (Al) are disposed at predetermined intervals along the outer perimeter of the semiconductor chip 15, for example. Further, although, in the example shown in FIG. 1(A), the planar shape of the semiconductor chip 15 is square and therefore the first and second electrode pads (14a, 14b) are arranged linearly along the sides of this square, the placement quantity of the electrode pads 14 and the positions thereof are not restricted to those of this embodiment, it being also acceptable to arrange the electrode pads 14 opposite one another in sets on the semiconductor chip 15, for example (the same is true for the embodiments below).

In this constitutional example, as shown in the illustrated region Q, the first electrode pads 14a, and first solder balls 22 whose connecting relationship with the first electrode pads 14a is designated, that is, which correspond to the first electrode pads 14a, are electrically connected via the first and second re-distribution wiring layers (20, 21) that comprise copper (Cu), for example. At the same time, the second electrode pads 14b and second solder balls 24 which correspond with the second electrode pads 14b are electrically connected via the second re-distribution wiring layer 21.

Figure 1B:
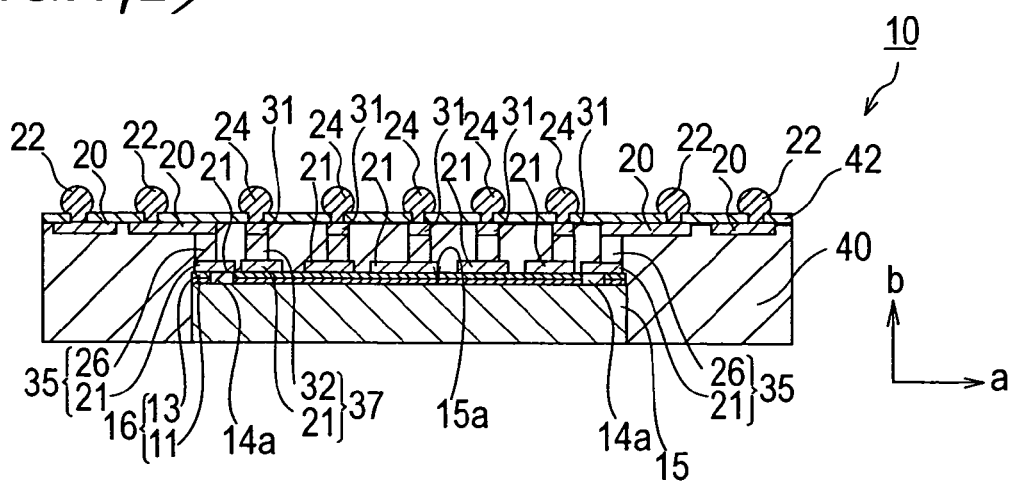
FIG. 1(B) is a schematic cross-sectional view of part of the semiconductor device taken along the line 1B—1B in FIG. 1(A) according to the first embodiment of the present invention.

More specifically, as shown in FIG. 1(B), an insulating film 16, which sequentially comprises a passivation film 11 and a protective film 13, is formed on the semiconductor chip 15, such that the surface of the electrode pads (14a, 14b) (here only the first electrode pads 14a are illustrated), the top surfaces of the pads, for example, are exposed. Here, the passivation film 11 is a silicon oxidation film ($SiO_2$), for example, and the protective film 13 is a film of low hardness such as polyimide resin film that alleviates impacts and concentrations of stress on the semiconductor chip 15.

The first electrode pads 14a are electrically connected to first wiring portions 35. The first wiring portion may be called as a first wiring structure. Each of the first wiring portions 35 is constituted comprising a special second re-distribution wiring layer 21 and a second conductive portion 26 which is a first protrusion (first post portion) that is substantially orthogonal to the main surface 15a of the semiconductor chip. The second conductive portion 26 may be called as a bump portion. Further, the first wiring portions 35 are electrically connected to the first re-distribution wiring layer 20 that extends in a first direction (direction of the arrow a in the figure) that lies substantially orthogonal to the protrusion direction of the first wiring portions 35. The first re-distribution wiring layer 20 may be called as a second wiring structure. Although, in this constitutional example, the constitution involves interposing the second re-distribution wiring layer 21 between the first electrode pads 14a and the first solder balls 22, a constitution in which the first re-distribution wiring layer 20 is connected to first post portions 26 formed directly above the first electrode pads 14a, for example, is also acceptable and can be optionally selected in accordance with the objectives and design and so forth.

Further, the second electrode pads 14b (See FIG. 1(A)) are electrically connected to second wiring portions 37. Each of the second wiring portions 37 is constituted comprising a special second re-distribution wiring layer 21 and a second conductive portion 32 which is a second protrusion (second post portion) that is substantially orthogonal to the main surface 15a of the semiconductor chip. The second conductive portion 32 may also be called as a bump portion. Further, the second wiring portions 37 are electrically connected to first conductive portions 31 that comprise the same material as the first re-distribution wiring layer 20.

Further, epoxy resin or similar is allowed to form a cover to a height at which the surface of the first re-distribution wiring layer 20 and the surface of the first conductive portions 31 are exposed, and a sealing layer 40 is thus formed. A level surface is preferably formed by the surfaces of the first re-distribution wiring layer 20 and first conductive portions 31 and by the surface of the sealing layer. A surface region of the sealing layer over the semiconductor chip 15 is called as a first region, and the remaining surface region of the sealing layer outside the first region is called as a second region.

Further, the first solder balls (first external terminals) 22 and the second solder balls (second external terminals) 24, which constitute bumps affording a connection to the mount substrate (print substrate) (not illustrated) and so forth, are formed on the exposed surfaces of the first re-distribution wiring layer 20 and the first conductive portions 31 which are exposed via openings in a surface protective film 42 which is created by the polyimide resin or similar formed on the sealing layer 40.

According to the present embodiment, the first re-distribution wiring layer 20 connected to the first wiring portions 35 described above extends from within the planar region (the region corresponds to the first region) of the semiconductor chip 15 to outside the border line of this region when the semiconductor chip 15 is viewed as a plane from above in a second direction (the direction of the arrow b in the figure) that is substantially orthogonal to the first direction in which the first re-distribution wiring layer 20 extends, that is, a direction perpendicular to the main surface 15a of the semiconductor chip. The first direction is shown as the direction of the arrow a in the figure.

Because the first solder balls 22 can be disposed outside the border line of the semiconductor chip 15, that is, in desired positions in the region (the region corresponds to the second region) outside the semiconductor chip 15 by utilizing the first re-distribution wiring layer 20 thus provided, a fan-out structure can be formed.

In addition, according to the present embodiment, the first wiring portions 35 that extend from the insulating film 16, and the first re-distribution wiring layer 20 are buried in the same buried layer, such as the sealing layer 40.

Where the fan-out structure according to the WB method and the like used thus far is concerned, the constitution has been such that the signal transmission paths (wiring) form boundaries with a plurality of materials.

For this reason, the transmission paths of the conventional constitution were subject to the influences of hardening contraction and thermal expansion due to variations in the peripheral environment or to impacts and so forth, and, as a result, there was a risk of deterioration of the electrical characteristics of the semiconductor device.

However, as a result of thus burying the first wiring portions 35 and the first re-distribution wiring layer 20 in the same buried layer (the sealing layer 40 here), the material that forms a boundary with the signal transmission paths is one and the same.

Accordingly, because it is possible to suppress concentrations of stress and so forth which are produced due to there being a plurality of materials forming a boundary with the signal transmission paths as per the prior art, high reliability can be maintained regardless of the peripheral environment and the like.

In addition, as a result of thus making the buried layer the sealing layer 40 which is formed with the object of protecting the semiconductor device 10, the sealing layer, and the part which corresponds with the wiring layer base (interposer) for forming the fan-out structure can be formed at the same time, and hence an increase in the number of fabrication steps can be suppressed (described subsequently).

In the semiconductor chip 15 according to this constitutional example, output signals from the first electrode pads 14a are transmitted to the first solder balls 22 via the first wiring portions 35 and the first re-distribution wiring layer 20 in that order. Further, output signals from the second electrode pads 14b are transmitted to the second solder balls 24 via the second wiring portions 37 and the first conductive portions 31. Also, input signals from the first and second solder balls (22, 24) are transmitted via paths that are the reverse of those described above.

Next, a description will be provided below with regard to the fabrication method of the semiconductor device 10, with reference to FIGS. 2(A) to FIG. 4(B).

First of all, the first stacked body formation step entails forming, on the semiconductor chip 15, second conductive portions 26 which are first protrusions (first post portions) and second conductive portions 32 which are second protrusions (second post portions), which are both electrically connected to the semiconductor chip 15 and protrude so as to be substantially orthogonal to the main surface 15a of the semiconductor chip, that is, substantially vertically to the main surface.

Thus, a first stacked body 50, which comprises the first wiring portions 35 having the second re-distribution wiring layer 21 and the second conductive portions 26, and the second wiring portions 37 having the second re-distribution wiring layer 21 and the second conductive portions 32, is formed on the first semiconductor chip 15. As is commonly known, electrode pads are provided on the semiconductor chips 15. Further, although two first and second electrode pads 14a, 14b are provided in the constitutional example shown in FIGS. 2(A) to 2(D), only the first electrode pads 14a are illustrated in the drawings.

At the time of formation of the first stacked body 50, first a silicon oxidation film 11 which is a passivation film and a polyimide resin film 13 which is a protective film are sequentially provided on a wafer 23 on which a plurality of the semiconductor chip 15 having a plurality of circuit elements is aligned by means of an ordinary wafer process such as an impurity diffusion treatment. The insulating film 16 is formed by the stacking of these films. Although, for the sake of convenience, only two semiconductor chips 15 are illustrated in the drawings, the quantity of the chips 15 is not limited to this number.

Figure 2A:
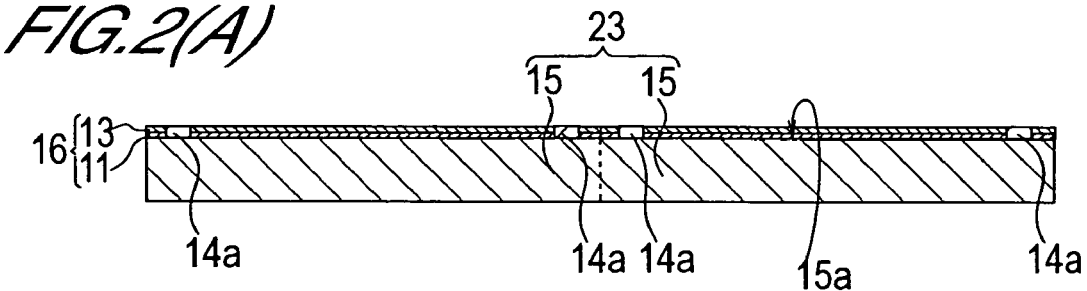
FIGS. 2(A) to 2(D) are schematic cross-sectional views that are used to describe the fabrication steps of the semiconductor device according to the first embodiment of the present invention.
Figure 2B:
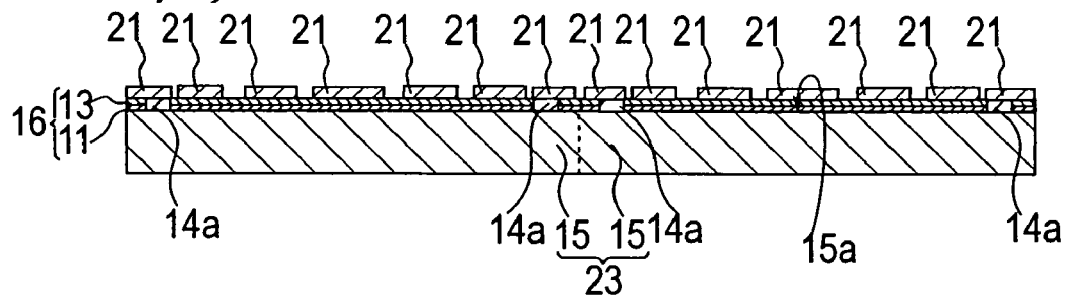

Thereafter, after forming a photoresist (not shown) on the surface of the insulating film 16, a photolithographic process is performed such that openings are created in parts of the insulating film 16 which correspond with the surfaces of the first and second electrode pads 14a, 14b, that is, the tops thereof (FIG. 2(A)).

Thereafter, after forming a copper (Cu) film, for example, by means of sputtering or similar, over the main surface 15a of the semiconductor chip, a photolithographic process is performed to form the second re-distribution wiring layer 21. The positions in which the resulting sections of the second wiring layer 21 are formed permit the first and second solder balls (22, 24) to be formed in the desired positions (FIG. 2(B)).

Figure 2C:
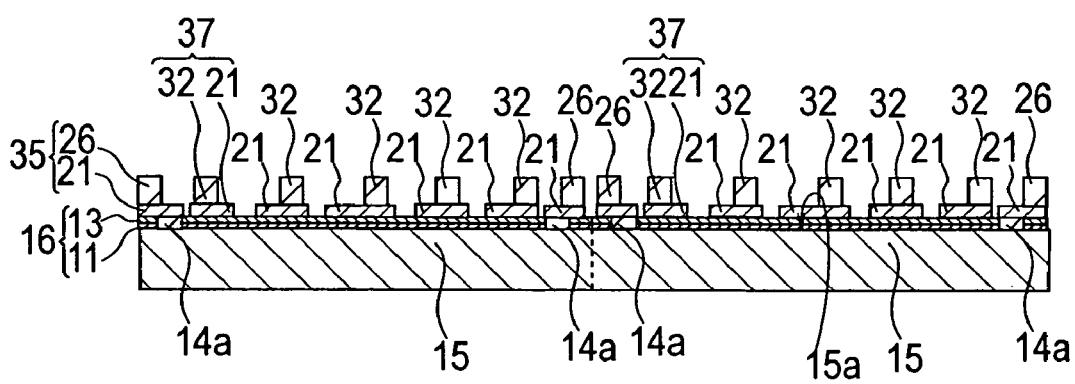

Next, the first protrusions (first post portions) 26 and the second protrusions (second post portions) 32 which both comprise copper are formed on the sections of the second re-distribution wiring layer 21 by means of electrolytic plating or the like (FIG. 2(C)). Thus, the first wiring portions 35 and the second wiring portions 37 are obtained on the main surface 15a of the semiconductor chip, the first wiring portions 35 having the first protrusions portions 26 which protrude so as to be substantially orthogonal to the main surface 15a and the second wiring portions 37 having the second protrusions 32 which protrude so as to likewise be substantially orthogonal to the main surface 15a.

Figure 2D:
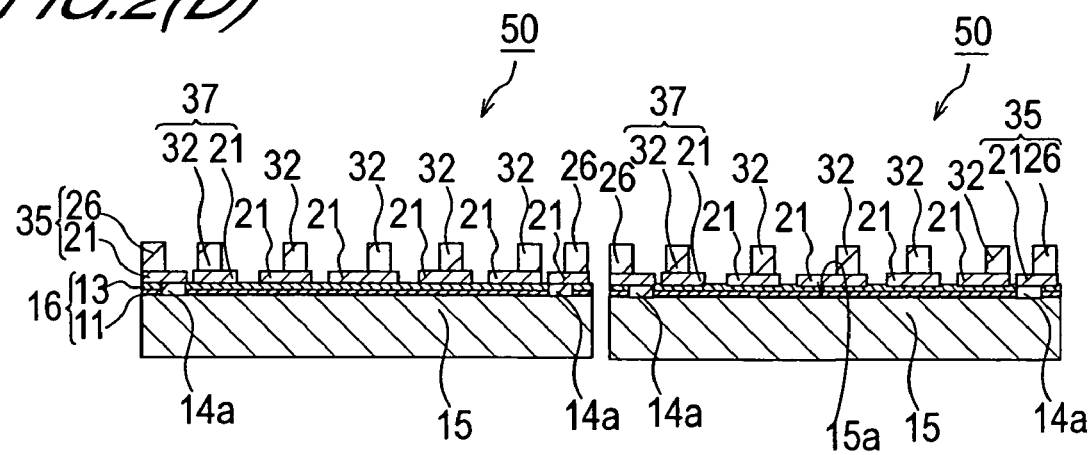

Thereafter, separation into individual semiconductor chips 15 is carried out by means of a blade (cutting tool) or similar, whereby the first stacked body 50 comprising the first and second wiring portions 35 and 37 is obtained on the semiconductor chip 15 (FIG. 2(D)).

Preferably, a second surface reforming step may also be performed up until a third stacked body forming step (described subsequently) is formed, with respect to the exposed surface of the insulating film 16 in the first stacked body 50 thus obtained. This surface reforming step is processing that entails the introduction of polar groups to the exposed surface of the insulating film 16.

The introduction of polar groups is carried out by plasma processing and, as a result of this processing, organic material that is stuck to the exposed surface of the insulating film 16 is removed and polar groups are formed in the exposed surface of the insulating film 16. As a result, the adhesion between the exposed surface of the insulating film 16 and the sealing layer 40 formed in a subsequent step can be improved. Further, this polar group introduction processing can be performed under the processing conditions that, for example, the plasma oxide output have a value in the range 0.1 KW to 1 KW, the processing time have a value in the range 30 seconds to 180 seconds, and the processing temperature have a value in the range from 50° C. to 100° C.

Next, as a result of a second stacked body formation step, a temporary substrate 63 and a second stacked body 60, which comprises the first re-distribution wiring layer 20 and first conductive portions 31 which are provided on the temporary substrate 63, are formed. In this case, the temporary substrate 63 is first prepared. This temporary substrate 63 is preferably constituted by a silicon substrate 61 and a polyimide film 62 which is an insulating layer provided as the surface of the silicon substrate 61. Further, the temporary substrate 63 has a chip mount face that is larger than the outer dimensions of the semiconductor chip 15. Further, within the mount face, the surface region where the semiconductor chip 15 is actually placed is also referred to as the mount region or placement face.

Next, the first re-distribution wiring layer 20 is provided so as to be disposed such that, when the first stacked body 50 is mounted in a predetermined position on the mount face of the temporary substrate 63, the first re-distribution wiring layer 20 is capable of contacting the first wiring portions 35 of the first stacked body 50 which correspond on the first stacked body 50 side, that is, whose connection is designated. In addition, the sections of the first re-distribution wiring layer 20 are provided so as to be disposed so as to extend from within a region (first region) on the mount face of the temporary substrate 63 which is opposite to the first stacked body 50 to within a non-opposite region (second region).

Furthermore, here, the first re-distribution wiring layer 20 and the first conductive portions 31 that comprise the same material are formed on the temporary substrate 63 at the same time in positions permitting contact with corresponding second wiring portions 37 of the first stacked body 50, that is, whose connection is designated. The first re-distribution wiring layer 20 and first conductive portions 31 can be formed at the same time by performing a photolithographic process after forming a copper film on the polyimide film 62 by means of sputtering, or the like, for example.

Thus, the first re-distribution wiring layer 20, which also serves to allow the first solder balls 22 to be arranged in the desired positions, is obtained. Further, because a WCSP wiring process which is the same as that for the formation of the above-described first stacked body 50 can be applied in the formation of the second stacked body 60, an increase in the fabrication costs of the semiconductor device can be suppressed.

Figure 3A:
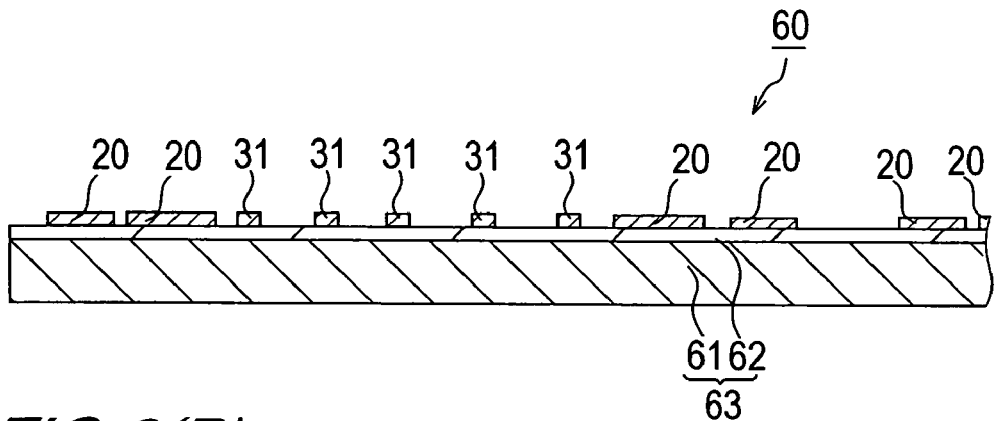
FIGS. 3(A) to 3(C) are schematic cross-sectional views that are used to describe the fabrication steps of the semiconductor device according to the first embodiment of the present invention.

The second stacked body 60 for which the first re-distribution wiring layer 20 and the first conductive portions 31 which correspond to the first stacked body 50 are formed on the common temporary substrate 63 is thus obtained (FIG. 3(A)). In addition, in this constitutional example, prior to forming the copper film on the insulating layer 62 by means of sputtering or similar, the surface of the insulating layer 62 is preferably subjected to ashing or similar which constitutes the first surface reforming step.

As a result, an ashing layer comprising organic matter, which is produced by subjecting the surface of the insulating layer 62 to ashing, is formed. As a result, it is possible to lower the adhesion between the exposed surface of the insulating layer 62 and the sealing layer 40 formed in a subsequent step, whereby a peeling step may be easily performed. Further, the ashing processing can be performed under the processing conditions that, for example, the plasma oxide output have a value in the range 2 KW to 5 KW, the processing time have a value in the range 200 seconds to 5000 seconds, and that the plasma oxidation processing temperature have a value in the range 50° C. to 100° C.

Next, the joining step entails mounting the first stacked body 50 in a predetermined region of the mount face on the temporary substrate 63 described above, that is, in the mount region, so as to cause contact between the first re-distribution wiring layer 20 and the first wiring portions 35, and the first conductive portions 31 and the second wiring portions 37.

Figure 3B:
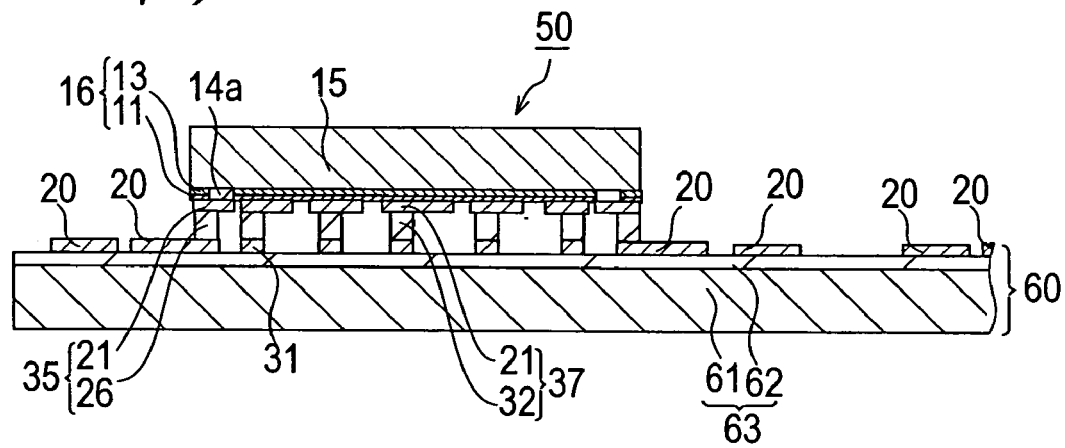
Figure 3C:
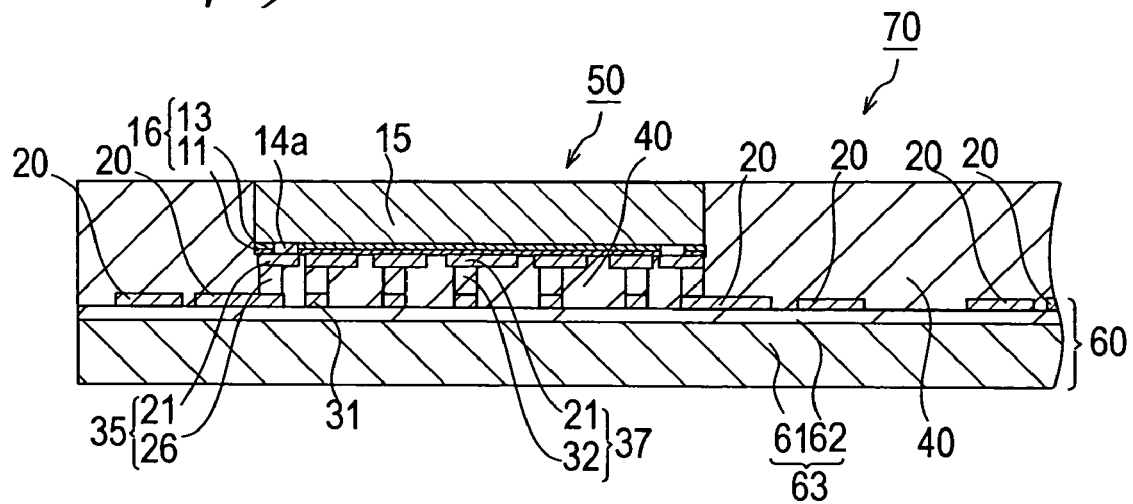

Subsequently, as shown in FIG. 3(B), the contacting parts constituted by the first protrusions 26 which the first wiring portions 35 comprise, and the first re-distribution wiring layer 20, as well as by the second protrusions 32 which the second wiring portions 37 comprise, and the first conductive portions 31, are joined using solder and the like, for example.

In addition, in this constitutional example, oxidation processing is preferably performed as the third surface reforming step up until the third stacked body formation step is performed, with respect to the exposed surfaces of the first and second wiring portions (35, 37), the first re-distribution wiring layer 20 and the first conductive portions 31.

As a result of this surface oxidation processing, an oxidation film is formed on the exposed surfaces of the first and second wiring portions (35, 37), the first re-distribution wiring layer 20 and the first conductive portions 31. The adhesion between the exposed surfaces of the first and second wiring portions (35, 37), the first re-distribution wiring layer 20 and the first conductive portions 31, and the sealing layer 40 formed in a subsequent step can be improved by means of this oxidation film. Also, the oxidation processing (thermal oxidation processing) can be performed under the processing conditions that, for example, the processing temperature in the atmosphere have a value in the range 50° C. to 100° C., and that the processing time have a value in the range 10 minutes to 60 minutes. In addition, the oxidation processing can be performed under other processing conditions, that is, under the conditions that, for example, the processing temperature in a nitrogen (N2) atmosphere have a value in the range 150° C. to 200° C., and the processing time have a value in the range 30 minutes to 120 minutes.

Next, the third stacked body formation step entails, after the above-described joining step, covering the first stacked body 50 and the first re-distribution wiring layer 20 with a sealing layer (sealing) to form a third stacked body 70 that comprises the first stacked body 50 and the second stacked body 60.

For this reason, first of all, epoxy resin is coated by means of spin coating or similar such that the first stacked body 50, the first re-distribution wiring layer 20 and the first conductive portions 31 are buried, whereby the sealing layer 40 is formed. Thereafter, the epoxy resin is cured by means of curing to obtain the third stacked body 70 (FIG. 3(C)).

Next, the peeling step entails peeling the temporary substrate 63 from the third stacked body 70.

Therefore, by using a vacuum adsorption device to adsorb the surface (the reverse side denoted by X in the figure) which is opposite to the surface (main surface) for forming the electrode pads (14a, 14b) of the semiconductor chip 15, of the two surfaces opposite the first stacked body 50, or using a vacuum adsorption device to adsorb the surface (the reverse side denoted by Y in the figure) which is opposite to the surface (mount face) for forming the insulating layer 62, of the two surfaces opposite the second stacked body 60, for example, peeling (removal) is performed by separating either one of the surface of the first stacked body 50 and the surface of the second stacked body 60 so that this surface is drawn apart from the other of these two surfaces.

The first re-distribution wiring layer 20 and the first conductive portions 31 are transferred to the first stacked body 50 as a result of only the temporary substrate 63 being peeled from the third stacked body 70.

Figure 4A:
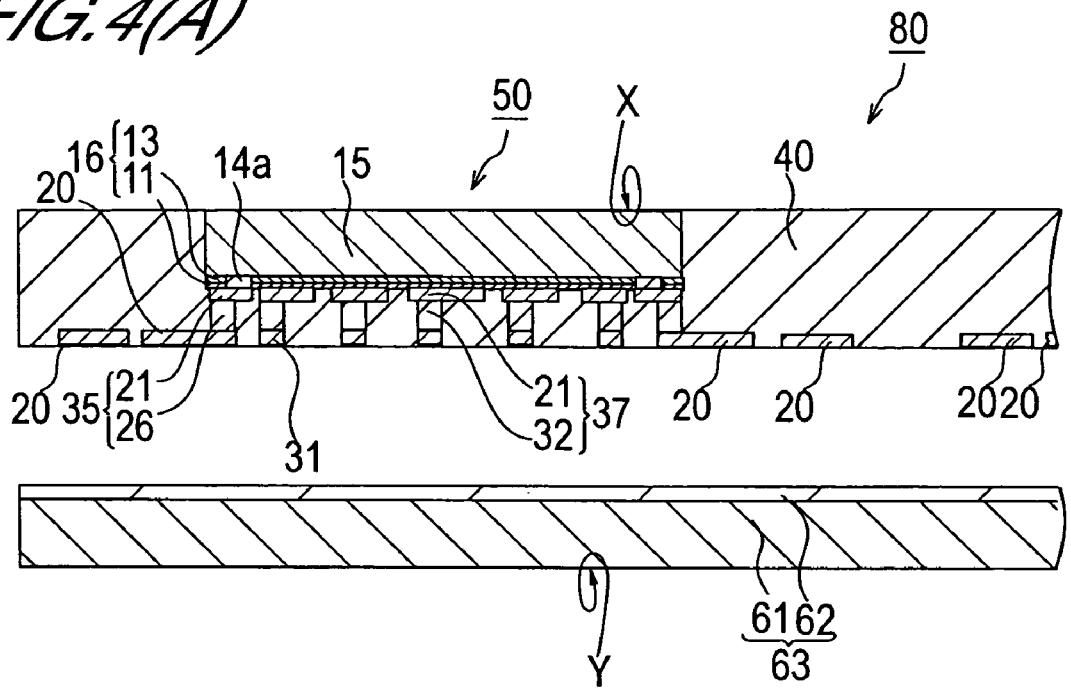
FIGS. 4(A) and 4(B) are schematic cross-sectional views that are used to describe the fabrication steps of the semiconductor device according to the first embodiment of the present invention.
Figure 4B:
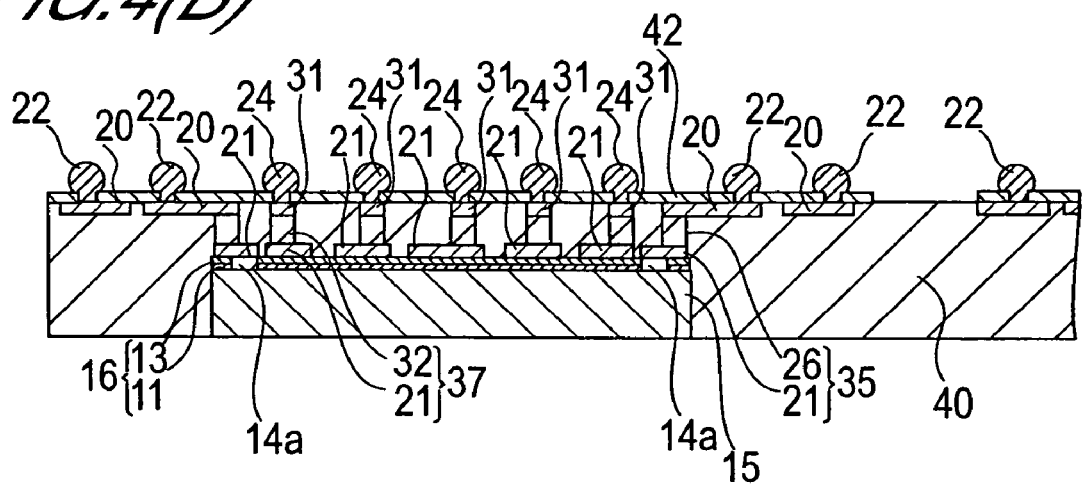

As a result, a fourth stacked body 80 which is produced as a result of parts corresponding to the first re-distribution wiring layer base (interposer) being formed collectively by means of the sealing layer 40 is obtained (FIG. 4(A)).

Further, because the above-described first to third surface reforming steps are suitably performed at a stage before this peeling step is performed, the peeling of the temporary substrate 63 can be performed reliably and in a straightforward manner.

Thereafter, after polyimide resin or the like has been formed over the whole of the surface opposite the reverse side X of the fourth stacked body 80, the surface protective film 42 is formed with openings formed in the external terminal formation region by means of photolithography. Then the first and second solder balls (22, 24) are formed by means of reflow on the first re-distribution wiring layer 20 and the first conductive portions 31 respectively which constitute external terminal mount faces that are exposed via the openings. Further, according to requirements, a barrier metal layer or similar may be formed between the external terminal mount faces and the solder balls (22, 24) (FIG. 4(B)).

Thereafter, cutting (see FIG. 1(B)) into individual semiconductor devices (packages) 10 is carried out by cutting between semiconductor devices by means of a high-speed rotary blade (cutting tool), or similar (not shown).

As is clear from the above description, according to this embodiment, a structure (fan-out structure) can be made in which the external terminals are also arranged in a fan-out section, and, accordingly, a semiconductor device which is more capable of adapting to an increase in the number of pins than an ordinary WCSP is produced.

Therefore, although, with a conventional semiconductor device, the chip size of an ordinary WCSP is undesirably enlarged only for a larger number of pins and the cumulative chip number per wafer is reduced, this embodiment permits a semiconductor device with a fan-out structure to be obtained regardless of the chip size.

Further, in a case where a high frequency signal is transmitted, for example, decay of this signal can be effectively suppressed in comparison with the WB method and matching of the characteristic impedance of the signal wires and the impedance of the semiconductor chip is straightforward, and, accordingly, a semiconductor device with superior high frequency characteristics is produced.

In addition, according to this embodiment, unlike the conventional case where a fan-out structure is rendered by the interposition of an interposer, a part that corresponds to this interposer is formed by the sealing layer.

As a result, concentrations of stress and so forth produced due to there being a plurality of materials forming a boundary with the signal transmission paths (wiring), as has been the case until now, can be suppressed, and therefore a semiconductor device that maintains high reliability is produced.

Further, in addition to it being possible to collectively form a sealing layer and parts corresponding to an interposer by means of sealing material, the wiring layers (the first re-distribution wiring layer and the first conductive portions 31) of the second stacked body 60 can be accurately formed on the first stacked body 50 by means of a transfer. Product costs can therefore be reduced.

Second Embodiment

The semiconductor device according to the second embodiment of the present invention will now be described with reference to FIG. 5.

With this embodiment, the main point of difference from the first embodiment is that a conductive portion that affords conduction between the two sides of the sealing layer 40 is formed in the sealing layer 40, one end of this conductive portion being electrically connected to the first re-distribution wiring layer 20. Further, constituent elements which are the same as those already described in the first embodiment are shown with the same numerals assigned thereto, and hence a specific description of these elements is sometimes omitted (as is also the case for the third to sixth embodiments below).

Figure 5:
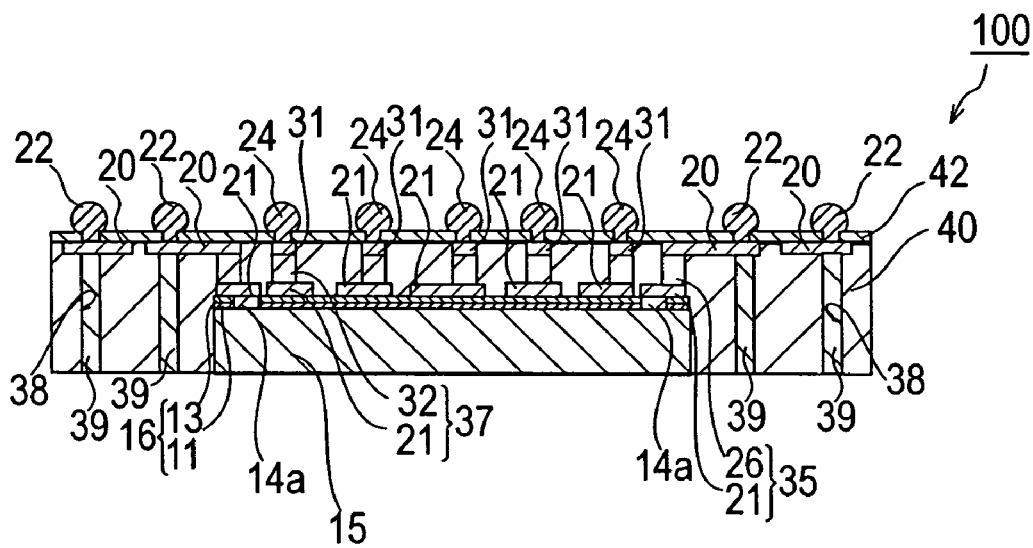
FIG. 5 is a schematic cross-sectional view of part of the semiconductor device according to a second embodiment of the present invention.

As shown in FIG. 5, a perforation hole 38, for example, is provided in the sealing layer 40 of the semiconductor device 100 of this embodiment, and conductive portions (of copper, for example) 39 are provided over the whole surface of the inner wall of the perforation hole 38 so as to pass through the two sides of the sealing layer 40. Further, one end of the conductive portions 39 is electrically connected to the first re-distribution wiring layer 20 and the other end is exposed via the sealing layer 40.

Further, the fabrication method of the semiconductor device 100 of this embodiment is the same as that for the first embodiment except for the fact that, before the joining step performed after the formation of the first re-distribution wiring layer 20 in the second stacked body formation step described in the first embodiment, the conductive portions 39, which comprise copper, are formed by means of a photolithographic process and electrolytic plating or the like in predetermined positions on the first re-distribution wiring layer 20. Further, the conductive portions need not necessarily be copper and may instead be made of nickel (Ni) or gold (Au) and so forth provided so as to enclose a core portion comprising resin material, for example.

As is clear from the above description, the present embodiment makes it possible to obtain effects like those for the first embodiment.

In addition, with this embodiment, heat generated by the circuit elements can be effectively dissipated by providing conductive portions that pass through the two sides of the sealing layer 40. Accordingly, damage resulting from the generation of heat by the circuit elements can be suppressed and the present invention can be applied to devices that generate a large amount of heat such as high power devices.

Third Embodiment

The semiconductor device according to the third embodiment of the present invention will now be described with reference to FIG. 6.

With this embodiment, the main point of difference from the second embodiment is that another semiconductor device 115 which is electrically connected to the other end of the conductive portions 39 is stacked in the thickness direction of the semiconductor chip 15 at this other end.

Figure 6:
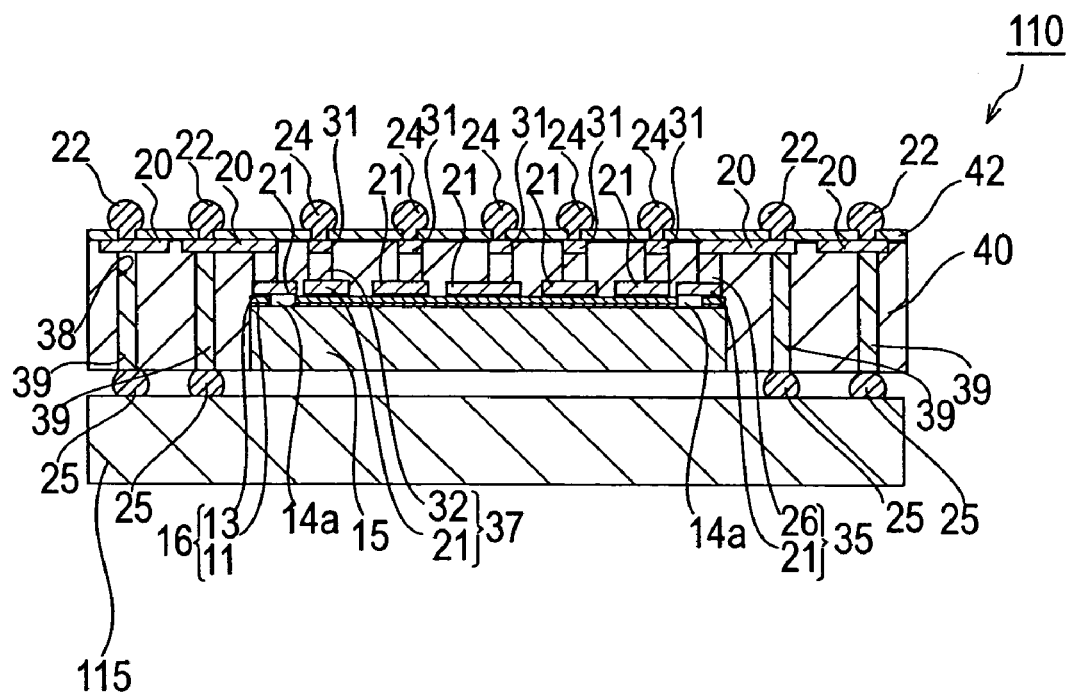
FIG. 6 is a schematic cross-sectional view of part of the semiconductor device according to a third embodiment of the present invention.

As shown in FIG. 6, a semiconductor device (package stacked type MCP) 110 of this embodiment has a constitution in which the other end of the conductive portions 39 of the semiconductor device 100 of the earlier described second embodiment, and solder balls 25 which the other semiconductor device 115 comprises are electrically connected to one another. Further, the other semiconductor device 115 may comprise external terminals that are capable of connecting to the semiconductor device 100. A detailed description of the structure is omitted here because the structure is not an essential part of the present invention.

Further, the fabrication method of the semiconductor device 110 of this embodiment may entail soldering the semiconductor device 100 of the second embodiment and the other semiconductor device 115 together by means of reflow processing.

As is clear from the above description, the present embodiment makes it possible to obtain effects like those for the first embodiment.

In addition, with this embodiment, by affording the semiconductor device 100 a constitution comprising a DRAM (Dynamic Random Access Memory) and affording the other semiconductor device 115 a constitution comprising a flash memory, for example, a package stacked-type MCP that implements higher density mounting is obtained.

Further, because a fan-in structure, which was problematic for a conventional WB method package stacked-type semiconductor device, is possible, miniaturization of the package size and thinner films are feasible.

Fourth Embodiment

The semiconductor device according to the fourth embodiment of the present invention will now be described with reference to FIG. 7.

With this embodiment, the main point of difference from the second embodiment is that, in the semiconductor chip, a conductive layer 41 is formed on the surface opposite the surface on which the wiring portions (35, 37) are provided in a protruding state, that is, the reverse side X (See FIG. 4(A)), and that this conductive layer 41 is electrically connected to the other end of the conductive portions 39.

Figure 7:
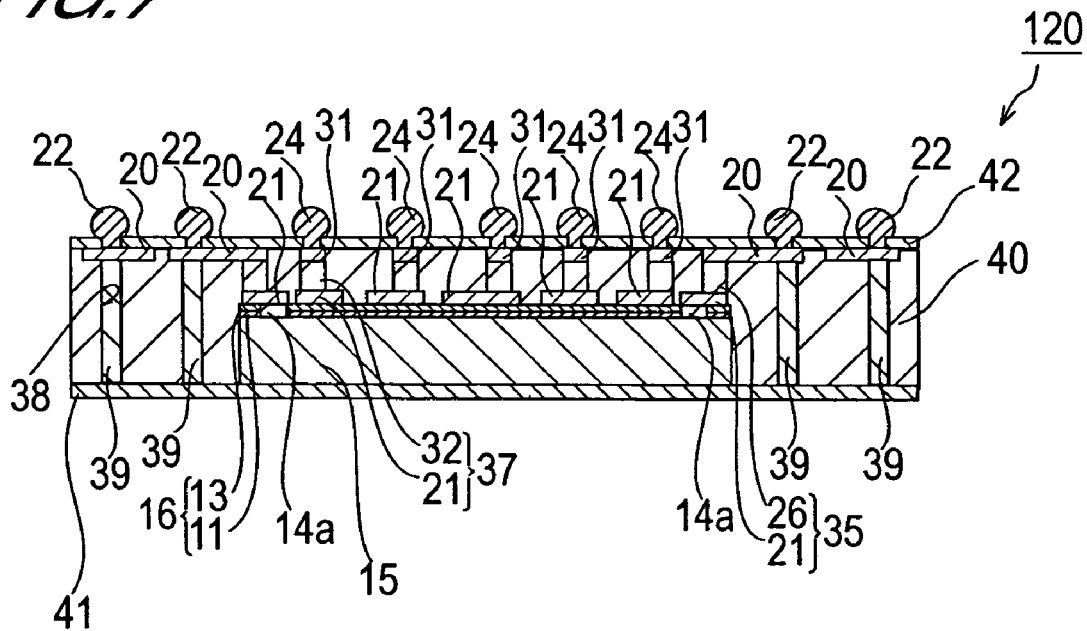
FIG. 7 is a schematic cross-sectional view of part of the semiconductor device according to a fourth embodiment of the present invention.

As shown in FIG. 7, a semiconductor device 120 of this embodiment comprises the conductive layer 41 which is electrically connected to the conductive portions 39 in at least a partial region of the reverse side X of the semiconductor device, that is, the reverse side of the semiconductor chip 15.

For example, because stable operation cannot be ensured in a complete depletion-type SOI (Silicon on insulator) CMOS due to slight fluctuations in the supply voltage, a reverse side potential is sometimes required.

Therefore, in this constitutional example, in order to ensure the stable operation of the complete depletion-type SOI CMOS and so forth, the conductive layer 41, which serves to afford the reverse side of the semiconductor chip 15 the desired potential (a supply or ground potential), is provided. Further, the conductive layer 41 can, for example, be a layer comprising anyone of copper, nickel, gold, palladium (Pd) and titanium (Ti) or a layer produced by stacking a plurality of such layers.

Furthermore, the fabrication method of the semiconductor device 120 of this embodiment entails turning the semiconductor device 100 obtained according to the second embodiment upside down and forming the conductive layer 41 by means of an optional suitable film deposition method (sputtering or the like) on the reverse side of the exposed semiconductor chip 15, for example.

As is clear from the above description, the present embodiment makes it possible to obtain effects like those for the first embodiment.

In addition, with this embodiment, because the conductive layer 41, which serves to afford the semiconductor chip 15 a reverse side potential (a supply or ground potential, for example), is provided, the constitution of this embodiment can be suitably applied to a semiconductor device that requires a reverse side potential, and the desired electrical characteristics for the semiconductor device can be assured.

Fifth Embodiment

The semiconductor device according to the fifth embodiment of the present invention will now be described with reference to FIG. 8. With this embodiment, the main point of difference from the first embodiment is that the first solder balls 22 and the second solder balls 24 are provided such that the distance (that is, the pitch) between the first solder balls 22 which are the first external terminals is greater than the distance (that is, the pitch) between the second solder balls 24 which are the second external terminals.

Figure 8:
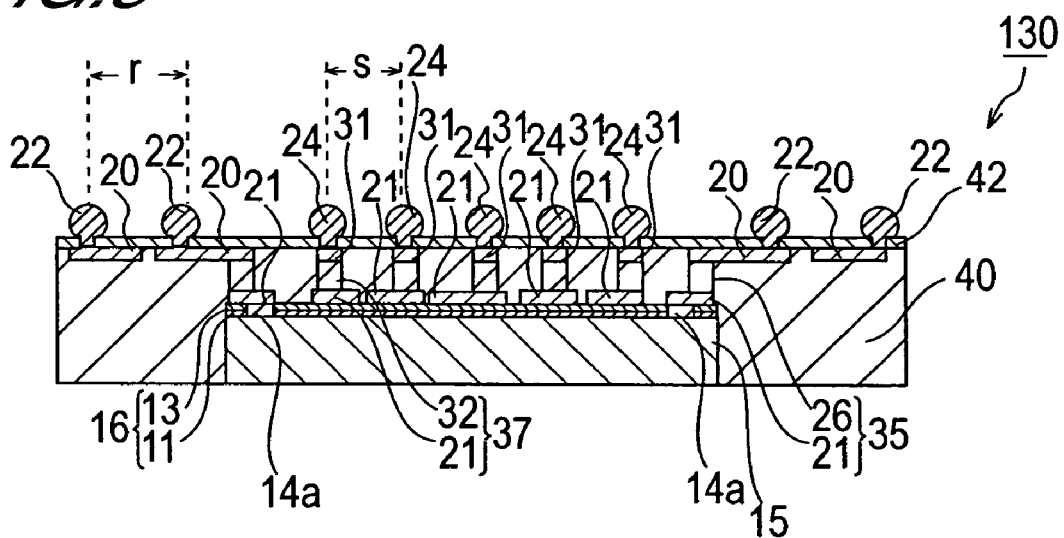
FIG. 8 is a schematic cross-sectional view of part of the semiconductor device according to a fifth embodiment of the present invention.

As shown in FIG. 8, a semiconductor device 130 of this embodiment is provided such that an interval r between adjoining first solder balls 22 formed in the fan-out section is greater than an interval s between adjoining second solder balls 24 formed in the fan-in section.

There are cases where a placement design according to which the distance between these solder balls is reduced to a certain extent in accordance with an increase in the number of solder balls (that is, a larger number of pins) arranged on the mount face is implemented.

In such a circumstance, higher density mounting in which the line and space width is narrowed on the mount substrate is required in order to guide the wiring of the mount substrate (the print substrate, for example) which corresponds to the external terminals. However, a mount substrate which undergoes high density wiring patterning is costly and therefore undesirable from the standpoint of reducing fabrication costs.

Therefore, because, in this constitutional example, the interval r for the first solder balls 22 is made broader than the interval s for the second solder balls 24, marked line and space alleviation can be achieved and therefore an inexpensive mount substrate can be employed.

As is clear from the above description, the present embodiment makes it possible to obtain effects like those for the first embodiment.

In addition, with this embodiment, a mount substrate that is inexpensive in comparison with that of the first embodiment can be used and hence fabrication costs can be reduced below those for the first embodiment.

Sixth Embodiment

The semiconductor device according to the sixth embodiment of the present invention will now be described with reference to FIG. 9.

With this embodiment, the main point of difference from the fifth embodiment is that first solder balls 22 and the second solder balls 24 are provided such that the diameter of the first solder balls 22 is larger than the diameter of the second solder balls 24.

Figure 9:
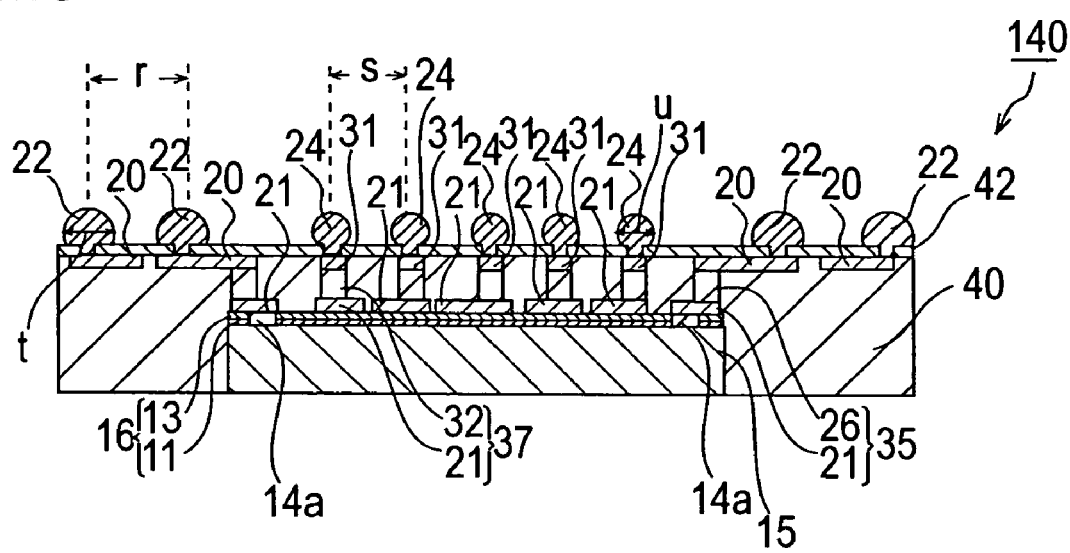
FIG. 9 is a schematic cross-sectional view of part of the semiconductor device according to a sixth embodiment of the present invention.

As shown in FIG. 9, a semiconductor device 140 of this embodiment is provided such that a diameter t of the first solder balls 22 formed in the fan-out section is larger than a diameter u of the second solder balls 24 formed in the fan-in section.

Of the solder balls (22, 24) mounted on the mount substrate, the first solder balls 22 formed on the outside are especially susceptible to damage caused by temperature fluctuations and impacts and so forth while the semiconductor device is driven, and sometimes a disconnection results.

Therefore, with this constitutional example, the first solder balls 22 can be effectively protected from variations in the peripheral environment and so forth by preparing the first solder balls 22 and the second solder balls 24 such that the diameter t of the first solder balls 22 that are susceptible to damage is larger than the diameter u of the second solder balls 24.

As is clear from the above description, the present embodiment makes it possible to obtain effects like those for the fifth embodiment.

In addition, with this embodiment, the connection which the solder balls have with the mount substrate can be more reliably maintained than with the fifth embodiment.

The present invention described above is not limited to only combinations of the above-described embodiments. Hence, the present invention can be applied by optionally combining suitable conditions at suitable stages.

For example, although semiconductor devices with a fan-in/fan-out structure were described in the above embodiments, cases where a semiconductor device comprises only a fan-out structure are also acceptable depending on the objectives and design.

What is claimed is:

1. A semiconductor device, comprising:
   a semiconductor chip having an electrode pad provided on a main surface thereof;
   a wiring portion which is electrically connected to said electrode pad and which includes a bump portion substantially orthogonal to said main surface;
   a wiring layer which is electrically connected to said wiring portion; and
   a sealing layer which covers the perimeter and main surface of said semiconductor chip such that the surface of said wiring layer is exposed,
   wherein said wiring layer is provided in the surface of said sealing layer, and extends from a first region of said sealing layer over said main surface to a second region of said sealing layer outside the first region.

2. The semiconductor device according to claim 1, further comprising an external terminal which is provided in the second region and which is electrically connected to a portion of said wiring layer in the second region.

3. The semiconductor device according to claim 2, further comprising a conductive portion formed in a through hole provided in said sealing layer and having one end and the other ends thereof, said one end of the conductive portion being electrically connected to said wiring layer.

4. The semiconductor device according to claim 3, wherein another semiconductor device which is electrically connected to the other end of said conductive portion is stacked at said other end.

5. The semiconductor device according to claim 3, further comprising a conductive layer formed on the reverse side of said semiconductor chip which is opposite to said main surface, wherein said conductive layer is electrically connected to the other end of said conductive portion.

6. The semiconductor device according to claim 4, further comprising a conductive layer formed on the reverse side of said semiconductor chip which is opposite to said main surface, wherein said conductive layer is electrically connected to the other end of said conductive portion.

7. The semiconductor device according to claim 1, further comprising a conductive portion formed in a through hole provided in said sealing layer and having one and the other ends thereof, said one end of the conductive portion being electrically connected to said wiring layer.

8. The semiconductor device according to claim 7, wherein another semiconductor device which is electrically connected to the other end of said conductive portion is stacked at said other end.

9. The semiconductor device according to claim 7, further comprising a conductive layer formed on the reverse side of said semiconductor chip which is opposite to said main surface, wherein said conductive layer is electrically connected to the other end of said conductive portion.

10. The semiconductor device according to claim 8, further comprising a conductive layer formed on the reverse side of said semiconductor chip which is opposite to said main surface, wherein said conductive layer is electrically connected to the other end of said conductive portion.

11. A semiconductor device, comprising:
    a semiconductor chip having first and second electrode pads provided on a main surface thereof;
    a first wiring portion which is electrically connected to said first electrode pad and which includes a first bump portion substantially orthogonal to said main surface;
    a second wiring portion which is electrically connected to said second electrode pad and which includes a second bump portion substantially orthogonal to said main surface;
    a first wiring layer which is electrically connected to said first wiring portion;
    a first conductive portion which is electrically connected to said second wiring portion; and
    a sealing layer that covers the perimeter and main surface of said semiconductor chip such that the surfaces of said first wiring layer and first conductive portion are exposed,
    wherein said first wiring layer is provided in the surface of said sealing layer, and extends from a first region of said sealing layer over said main surface to a second region of said sealing layer outside the first region; and
    said first conductive portion is provided in the surface of said sealing layer within said first region.

12. The semiconductor device according to claim 11, further comprising:
    a first external terminal which is provided in said second region and which is electrically connected to a part of said first wiring layer; and a second external terminal which is provided in said first region and which is electrically connected to said first conductive portion, wherein the distance between the adjoining first external terminals is greater than the distance between the adjoining second external terminals.

13. The semiconductor device according to claim 12, wherein the diameter of said first external terminal is greater than the diameter of said second external terminal.

14. The semiconductor device according to claim 12, further comprising a conductive portion formed in a through hole provided in said sealing layer and having one and the other ends thereof, said one end of the conductive portion being electrically connected to said first wiring layer.

15. The semiconductor device according to claim 12, further comprising a conductive layer formed on the reverse side of said semiconductor chip which is opposite to said main surface, wherein said conductive layer is electrically connected to the other end of said conductive portion.

16. The semiconductor device according to claim 13, further comprising a conductive portion formed in a through hole provided in said sealing layer and having one and the other ends thereof, said one end of the conductive portion being electrically connected to said first wiring layer.

17. The semiconductor device according to claim 13, further comprising a conductive layer formed on the reverse side of said semiconductor chip which is opposite to said main surface, wherein said conductive layer is electrically connected to the other end of said conductive portion.

18. The semiconductor device according to claim 14, further comprising a conductive layer formed on the reverse side of said semiconductor chip which is opposite to said main surface, wherein said conductive layer is electrically connected to the other end of said conductive portion.

19. The semiconductor device according to claim 16, further comprising a conductive layer formed on the reverse side of said semiconductor chip which is opposite to said main surface, wherein said conductive layer is electrically connected to the other end of said conductive portion.

20. The semiconductor device according to claim 11, further comprising a conductive portion formed in a through hole provided in said sealing layer and having one and the other ends thereof, said one end of the conductive portion being electrically connected to said first wiring layer.

21. The semiconductor device according to claim 20, further comprising a conductive layer formed on the reverse side of said semiconductor chip which is opposite to said main surface, wherein said conductive layer is electrically connected to the other end of said conductive portion.

22. The semiconductor device according to claim 11, further comprising a conductive layer formed on the reverse side of said semiconductor chip which is opposite to said main surface, wherein said conductive layer is electrically connected to the other end of said conductive portion.

23. A semiconductor device comprising:
a semiconductor chip having a main surface, on which an electrode pad is formed;
a first wiring structure electrically connected to the electrode pad and including a bump portion;
a second wiring structure electrically connected to the first wiring structure; and
a sealing layer which covers the main surface and the side surfaces of the semiconductor chip so that a portion of the surface of the second wiring structure is not covered with the sealing layer,
wherein the second wiring structure extends from a first region to a second region, the first region being located at the sealing layer over the main surface of the semiconductor chip and the second region being positioned at the sealing layer formed on the side surfaces of the semiconductor chip.

24. The semiconductor device according to claim 23, further comprising an external terminal which is provided in the second region and which is electrically connected to a portion of said second wiring structure.

25. The semiconductor device according to claim 24, further comprising a conductive portion formed in a through hole provided in said sealing layer and having one and the other ends thereof, said other end of the conductive portion being electrically connected to said second wiring layer.

26. The semiconductor device according to claim 24, further comprising a conductive layer formed on the reverse side of said semiconductor chip which is opposite to said main surface, wherein said conductive layer is electrically connected to the other end of said conductive portion.

27. The semiconductor device according to claim 25, further comprising a conductive layer formed on the reverse side of said semiconductor chip which is opposite to said main surface, wherein said conductive layer is electrically connected to the other end of said conductive portion.

28. The semiconductor device according to claim 23, further comprising a conductive portion formed in a through hole provided in said sealing layer and having one and the other ends thereof, said other end of the conductive portion being electrically connected to said second wiring layer.

29. The semiconductor device according to claim 28, further comprising a conductive layer formed on the reverse side of said semiconductor chip which is opposite to said main surface, wherein said conductive layer is electrically connected to the other end of said conductive portion.

30. The semiconductor device according to claim 23, further comprising a conductive layer formed on the reverse side of said semiconductor chip which is opposite to said main surface, wherein said conductive layer is electrically connected to the other end of said conductive portion.

* * * * *